United States Patent
Uchida

(10) Patent No.: US 6,977,820 B2
(45) Date of Patent: Dec. 20, 2005

(54) ELECTRONIC CIRCUIT BOARD

(75) Inventor: Mamoru Uchida, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 278 days.

(21) Appl. No.: 10/430,215

(22) Filed: May 7, 2003

(65) Prior Publication Data

US 2003/0223202 A1 Dec. 4, 2003

(30) Foreign Application Priority Data

May 29, 2002 (JP) .............................. 2002-155878

(51) Int. Cl.[7] ................................................ H05K 1/18
(52) U.S. Cl. ....................... 361/761; 361/783; 361/795
(58) Field of Search ............................. 361/760, 762, 361/14; 385/14, 50; 250/214.1

(56) References Cited

U.S. PATENT DOCUMENTS

| | | | |
|---|---|---|---|
| 6,243,509 B1 * | 6/2001 | Chen ............................ | 385/14 |
| 6,396,968 B2 * | 5/2002 | Pillkahn ........................ | 385/14 |
| 6,804,423 B2 * | 10/2004 | Tsukamoto et al. ............ | 385/14 |
| 6,865,307 B1 * | 3/2005 | Ma et al. ....................... | 385/14 |
| 6,897,430 B2 * | 5/2005 | Uchida ...................... | 250/214.1 |
| 2005/0121683 A1 * | 6/2005 | Nakata .......................... | 257/99 |

* cited by examiner

Primary Examiner—Kammie Cuneo
Assistant Examiner—Ivan H Carpio
(74) Attorney, Agent, or Firm—Fitzpatrick, Cella, Harper & Scinto

(57) ABSTRACT

An electronic circuit board having an optical wiring layer sandwiched between two electrical wiring layers. The optical wiring layer is structured to be a two-dimensional optical waveguide. An E/O device and an O/E device are provided in the optical wiring layer or at an interface between the optical wiring layer and the electrical wiring layer. A via piercing the optical wiring layer connects the two electrical wiring layers. It is possible to efficiently input and output light to and from an optical wiring layer.

3 Claims, 11 Drawing Sheets

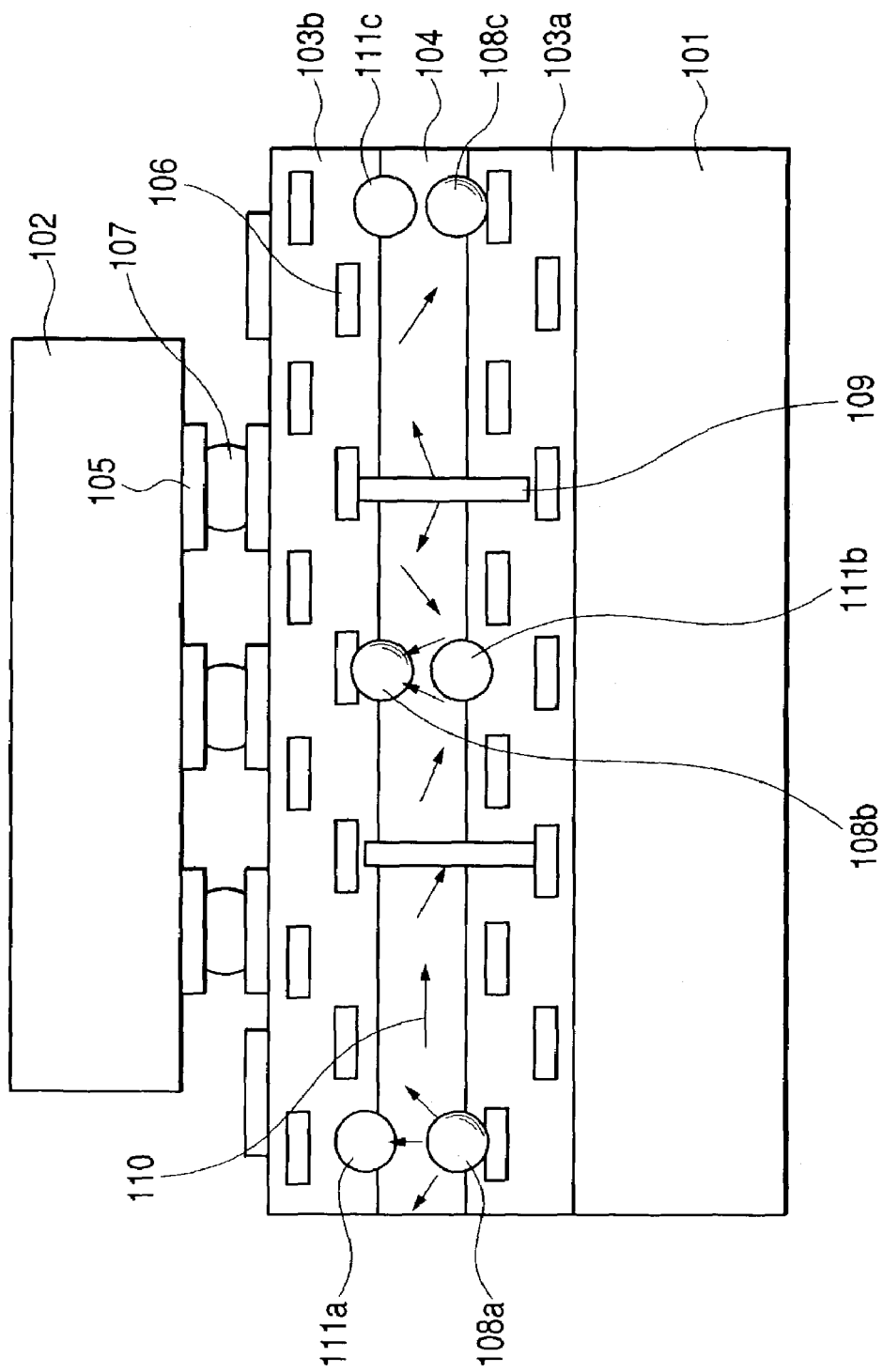

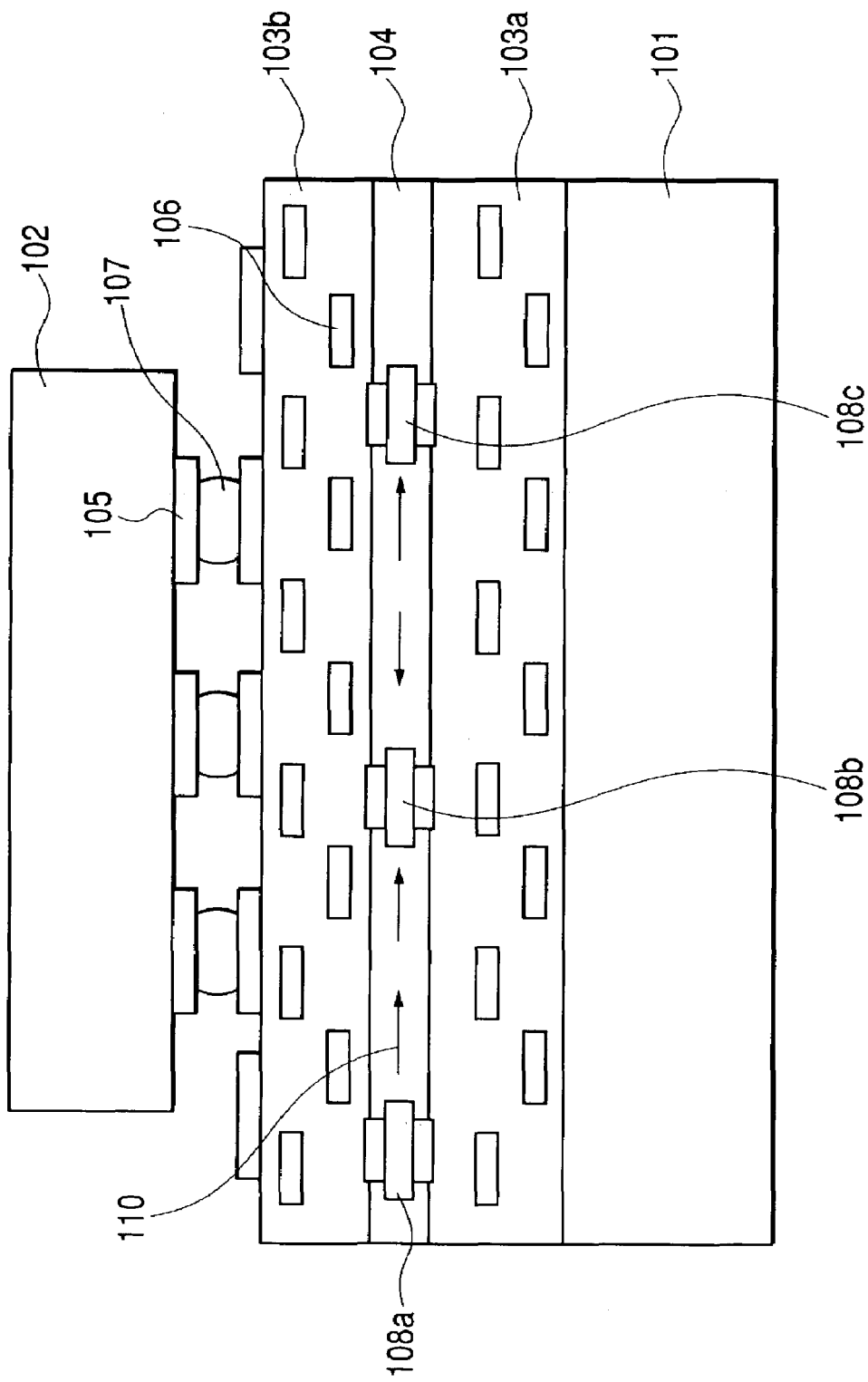

ELECTRONIC CIRCUIT BOARD

BACKGROUND OF THE INVENTION

1. Field of the Invention

The present invention relates to an electronic circuit board capable of highly densely mounting LSI chips such as CPU, memory, and the like. More specifically, the present invention relates to an opto-electronic circuit board (or an optical integrated circuit board) having an electrical wiring layer and an optical wiring layer.

2. Related Background Art

A cellular phone and a portable digital assistant (PDA) need to provide high-speed processing and compactness or light weight at the same time. However, it is pointed out that accelerating the processing speed increases the influence of wiring delay in the electronic circuit board. To minimize this influence, the simplest method is to make the wiring in a chip and between chips as short as possible. Since it can also miniaturize circuit boards, many inventions have been made for this purpose.

As the processing speed increases, however, another problem appears, i.e., a noise due to electromagnetic interferences (EMI).

Since electronic parts are arranged very closely to each other, the wiring becomes shorter but the wiring density becomes higher. When a high-speed signal is applied to adjacent signal lines, electromagnetic waves interfere with each other due to the mutual electromagnetic induction, causing a noise. As a result, the signal cannot be transmitted correctly. Mobile terminals, in particular, are more and more designed for low voltages, and are consequently driven with a large current, increasing effects of EMI.

This phenomenon means that the mobile terminal is susceptive to the external radio environment, i.e. so-called immunity or electromagnetic compatibility (EMC). That is, the fact that the mobile terminal itself easily generates EMI means that it easily sense an external electromagnetic field. Accordingly, normal data processing is unavailable depending on the radio environment.

Usually, these problems are solved by multilayering a ceramic substrate and enhancing EMC (i.e. electromagnetic compatibility) for each layer. However, it raises problems about costs and yield ratios, while it is essentially impossible to provide an EMI-free environment.

On the other hand, there is proposed a method of using optical wiring that essentially has an advantage of no electromagnetic induction.

According to Japanese Patent Application Laid-Open No. 9-96746 ("Active optical circuit sheet or active optical circuit board" by Yoshimura et al.), for example, an optical wiring section is separated from an electrical wiring section. Based on a signal voltage from an electronic instrument, an optical switch or an optical modulator converts an electric signal into an optical signal for transmission. The optical signal is reconverted into an electric signal by a light receiving element that is provided at a different position in the optical wiring section. Thus, an electric connection is made with another or the same instrument.

This method excels in compensating the demerit of the electrical wiring for the optical wiring. Since the optical wiring uses a one-dimensional optical waveguide (or fiber), however, it is necessary to predetermine a position for optical wiring. Further, the size for the optical wiring becomes much larger than that for the equivalent electrical wiring.

According to Japanese Patent Application Laid-Open No. 11-196069 ("Optical signal transmission apparatus, optical signal transmission method, and signal processing apparatus" by Sakai et al.), the signal light input/output section is arranged at each of both opposite ends of the two-dimensionally extending optical sheet bus. An optical signal is two-dimensionally transmitted in the optical sheet bus from one end. The light receiving element at the other end converts the optical signal into an electric signal. This method solves conventionally inevitable delays and transmission speed limitations in the electrical wiring and provides easy mounting. There are arranged a transmission device (e.g., one-dimensional semiconductor laser array) and a reception device (e.g., one-dimensional photodiode array) at both ends of a two-dimensional optical waveguide called an optical sheet (having a waveguide structure only in the thickness direction).

The signal operation is summarized as follows. A logic signal from the electric circuit directly drives the semiconductor laser to convert the electric signal into the optical signal. The generated light propagates inside the optical sheet. At this time, the light is guided in the thickness direction and freely propagates in the plane direction perpendicular thereto. As a result, through the necessary optical power becomes larger than the conventional one, to increase the load to the electrical circuit, tolerances for mounting the optical sheet and optical devices become much larger. This method also solves conventionally inevitable delays and transmission speed limitations in the electrical wiring.

SUMMARY OF THE INVENTION

However, the above-mentioned technology relates to inter-instrument wiring (bus line). No suppressing effects on EMI generated from a circuit board that mounts various electronic devices is expected. The technology concerns the wiring (bus line) between instruments and gives no consideration to connection of an electronic device at a given position to any other electronic devices in the same instruments.

It is premised that light enters the end of the optical sheet. No consideration has been given to supplying light perpendicularly to the optical sheet. As the inventors examined the entry of light into an optical sheet, it was found that efficiently supplying light is difficult just by providing a light emitting section on the optical sheet.

It is therefore an object of the present invention to provide an electronic circuit board capable of efficiently supplying light perpendicularly to the optical sheet, not from its end. It is another object of the present invention to provide an electronic circuit board capable of efficiently receiving the signal light propagated in the optical sheet An electronic circuit board according to the present invention has an optical wiring layer sandwiched between two electrical wiring layers, wherein the optical wiring layer is structured to be a two-dimensional optical waveguide; an E/O (electrical-to-optical signal conversation) device and an O/E (optical-to-electrical signal conversation) device are provided in the optical wiring layer or at an interface between the optical wiring layer and the electrical wiring layer; and a via piercing the optical wiring layer connects the two electrical wiring layers.

It is preferable that at least one of the E/O device and the O/E device is spherical, circular, or columnar.

Further, it may be preferable that the electrical wiring layer includes a parallel signal line with an output terminal connected to the E/O device; and a parallel electrical signal transmitted in the parallel signal line is parallel-serial converted in an electronic circuit provided in the E/O device and is then is then transmitted as a serial optical signal to the optical wiring layer.

Moreover, it may be preferable that the serial optical signal is received by the O/E device, then is converted into an electrical signal, then is serial-parallel converted by an electronic circuit provided in the O/E device, and is then transmitted to a parallel signal line.

The present invention makes it possible to efficiently input or output optical signals by providing the E/O device and the O/E device inside the optical wiring layer or at an interface between the optical wiring layer and the electrical wiring layer. The E/O device and the O/E device are so-called opto-electric conversion devices. The following description primarily refers to the use of a spherical opto-electric conversion device but is not limited thereto only if it is possible to input or output light to the optical wiring layer.

The electronic circuit board according to the present invention has a layered structure unit comprising two layers: an electrical wiring layer and an optical wiring layer. A plurality of electronic devices are arranged on the surface or inside of the circuit board. The electrical wiring layer includes electrical wiring that electrically connects the electronic devices with each other. The optical wiring layer is structured to be a film-shaped two-dimensional optical waveguide. The E/O device and the O/E device are provided in the electrical wiring layer, the optical wiring layer, or an interface between them. The E/O device converts an electrical signal from the electronic devices into an optical signal and transmits the optical signal into the optical wiring layer. The O/E device receives the optical signal and converts it into an electrical signal. In addition, the electrical connection to the E/O and O/E devices is made from the electrical wiring layer side.

In the electronic circuit board, there may be formed a plurality of vias that pierce the optical wiring layer and electrically connect the electrical wiring layers sandwiching the optical wiring layer. On a spherical semiconductor substrate, together with other electronic devices, there may be formed the E/O device that converts an electrical signal from an electronic device into an optical signal and transmits the optical signal into the optical wiring layer. On a spherical semiconductor substrate, together with other electronic devices, there may be integrated and formed the O/E device that converts an optical signal transmitted in the optical wiring layer into an electrical signal.

The electronic circuit board may have a parallel signal line whose output terminal is connected to the E/O device. The electronic circuit of the spherical device may perform a parallel-serial conversion to transmit a serial optical signal to the optical sheet. It is also possible to receive the serial optical signal at the O/E device embedded in the optical sheet. After the optical signal is converted into an electrical signal, the signal may be serial-parallel converted in the electronic circuit formed together on the spherical semiconductor substrate. The converted signal can be transmitted to a parallel signal line. The electronic circuit board can be configured with a flexible material.

Further, the electronic circuit board according to the present invention has a multi-layered structure comprising a plurality of layers. A unit constituting the multi-layered structure comprises two layers: an electrical wiring layer and an optical wiring layer. A plurality of electronic devices are arranged on the surface or inside of the circuit board. The electrical wiring layer includes electrical wiring that electrically connects the electronic devices with each other. The optical wiring layer is structured to be a film-shaped two-dimensional optical waveguide. The E/O device and the O/E device are provided in the optical wiring layer. The E/O device converts an electrical signal from the electronic devices into an optical signal and transmits the optical signal in all directions of the optical wiring layer. The O/E device receives the optical signal from all directions in the optical wiring layer and converts it into an electrical signal. In addition, the electrical connection to the E/O and O/E devices is made from the electrical wiring layer side.

In the electronic circuit board, there may be formed a plurality of vias that pierce the optical wiring layer and electrically connect the electrical wiring layers sandwiching the optical wiring layer. The E/O device to convert an electrical signal from the electronic device into an optical signal and to transmit the optical signal into the optical wiring layer may be shaped like a disk or a column. The O/E device to convert an optical signal transmitted in the optical wiring layer into an electrical signal may be shaped like a disk or a column.

The electronic circuit board may have a parallel signal line whose output terminal is connected to the E/O device. The electronic circuit of the spherical device may perform a parallel-serial conversion to transmit a serial optical signal to the optical wiring layer. It is also possible to receive the serial optical signal at the O/E device embedded in the optical wiring layer. After the optical signal is converted into an electrical signal, the signal may be serial-parallel converted in the electronic circuit formed together with the device. The converted signal can be transmitted to a parallel signal line.

(Operation)

When adjacent metal wirings provide high-speed data (e.g., 1 Gbps), the intensity of electromagnetic radiation noise nearby is expressed as: "generating source intensities (frequency, waveform, and drive current)"×"transfer constants (resonance with the power supply line and connection with an adjacent line)"×"antenna factors (connectors and electrodes)". That is to say, the noise level increases in proportion that the wiring length becomes longer, the electrical current amount increases, the signal speed increases, and the signal pulse approximates to a rectangular wave. Therefore, it is basically impossible to eliminate EMI as long as the metal wiring is used near the CPU.

The use of optical wiring substantially solves these problems. That is to say, the optical wiring makes the transfer constant to be zero because no electromagnetic induction occurs.

On the other hand, however, the physical size per optical wiring is over ten times larger than the electrical wiring as long as an optical waveguide is used. Replacing the entire electrical wiring with optical wiring rather emphasizes demerits such as a significantly increased size, an increased loss due to bending, and the like. Further, the use of such optical wiring necessitates a change in the conventional electrical wiring pattern. As a solution to relieve these problems, it is proposed that the conventional pattern is used for electrical wiring and the optical wiring uses an optical film for transmission in the two-dimensional space. However, there is not yet presented an effective solution for a method of mounting an E/O device to convert an electrical signal into an optical signal and an O/E device to convert an optical signal into an electrical signal. The present invention provides a technology of mounting O/E and E/O devices on the opto-electronic circuit board as an essential technology for embodying the solution.

The principal objective of the present invention is summarized as follows.

(1) A two-dimensional optical waveguide (optical film) is used for an optical waveguide as optical wiring to provide a multilayered opto-electronic circuit board structure comprising a pair of electrical wiring layers and an optical wiring layer.

(For the opto-electronic circuit board, refer to File No. 202349, now U.S. Pat. No. 6,897,430, "Opto-electronic wiring board, opto-electronic integrated circuit, and method of manufacturing the same".)

(2) A via is used for connection between a plurality of electrical wiring layers.

(3) The opto-electric conversion device to be used is a spherical photonic ball IC that comprises concurrent integration of an optical device and its drive IC or an amplifier.

The opto-electronic circuit board comprises an ordinary electronic circuit board or a printed circuit board (PCB) coupled with a two-dimensional optical waveguide. The electrical wiring part complies with the conventional technique. The optical wiring part uses the two-dimensional optical waveguide (optical film). This scheme solves the conventional problems that the optical wiring increases a wiring size, that the use of optical wiring has an effect on the electronic device arrangement, and the like. Further, it permits free selection between the electrical wiring and the optical wiring.

A via is a requisite means for the three-dimensional wiring. When the optical wiring layer is used, a large demerit will result if the via cannot be formed at a desired position. Since the present invention uses a film-shaped optical waveguide, an optical signal diffuses two-dimensionally to propagate even if the via is hence formed at any position. An effect of the via is hence negligible. Accordingly, it is possible to introduce EMI-free optical wiring with no influence on the conventional design principle.

The flip-chip mounting or the BGA (Ball Grid Array) method is used as a mounting method to facilitate the easy mounting without applying a new mounting method for optical wiring. The BGA method uses solder called a bump to connect an electrode pad on the IC to an electrode pad on the circuit board in an array. Compared to the conventional wire bonding, the BGA method excels in such characteristics as an increased speed, a small area required, and a low resistance.

Typically, the BGA pitch and the solder ball diameter are sized to be approximately 1 mm and 0.50 mm, respectively. When the photonic ball IC is 1 mm diameter or less, a BGA process can be used to easily satisfy the above-mentioned requirements.

The photonic ball IC is an integration of electronic devices and optical devices on a spherical semiconductor substrate (usually, a spherical Si substrate). A single photonic ball IC is capable of O/E or E/O conversion. No additional circuit is needed when the photonic ball IC to be used can be directly driven by a voltage of a logic signal from the LSI circuit formed in the opto-electronic circuit board. Since the photonic ball IC is spherical, it can be optically coupled to an optical film section of the opto-electronic circuit board without needing for a special optical system.

The following provides an overview of the photonic disk IC. (For details on the manufacturing method and the like, refer to Japanese Patent Application Laid-Open No. 10-262837, "Semiconductor laser capable of polarized wave modulation having ring resonator" or Japanese Patent Application Laid-Open No. 2000-022285, "Opto-electronic device".)

FIGS. 10A and 10B are schematic diagrams showing a ring resonator type semiconductor laser, hereafter referred to as a ring LD (laser diode), as a simplest example of the photonic disk IC. The ring LD device contains a ring resonator. When light orbits in the ring resonator, the ring LD obtains a gain to oscillate. In principle, light is confined in the resonator, but is partially extracted to the outside. A circular resonator can irradiate light in 360 degree directions inside the resonator plane. When this ring laser is provided in the optical wiring layer, the light can propagate inside the entire optical wiring layer.

The following explains the ring laser with reference to the accompanying drawings. FIGS. 10A and 10B are schematic diagrams of the ring laser.

FIG. 10A is a plan view. FIG. 10B is an elevational view with a fragmentary cross sectional view taken along lines 10B—10B for the left half. For example, the reference numeral 1301 represents an n-type semiconductor substrate, 1302 an n-type AlGaAs clad layer, 1303 an MQW active layer, and 1304 a p-type clad layer. There is formed a ring-shaped resonator 1307 (e.g., 200 $\mu$m long) having a vertical, smooth side surface. A cathode 1305 and an anode 1306 are formed for carrier injection. This laser is characterized as follows. When the carrier injection reaches a given level, the gain exceeds a resonator loss of the ring laser, activating two orbit oscillation modes clockwise and counterclockwise. Part of the laser beam (resonant beam 1308) can be extracted from the ring resonator side to the outside. A completely circular ring laser can transmit a laser beam (output beam 1309) to almost all the area at 360 degrees in the active layer plane of the ring laser. Let us consider that the ring laser is enclosed in a two-dimensional slab waveguide. In this case, when the anode and the cathode are superposed with an electrical signal at a level appropriate to the oscillation threshold value for the ring laser, the beam can be propagated throughout the entire two-dimensional slab waveguide as an optical signal.

On the other hand, the ring laser or a similar semiconductor device can operate as a light receiver. The ring resonator side can be used as a light receiving surface that receives light beams propagating from all directions in the plane where the ring resonator is placed. Applying an appropriate bias widens a depletion layer. This can improve the light receiving efficiency. The light receiver is hereafter referred to as a ring PD (photodiode).

When arranged in the optical wiring layer, the ring PD can receive a beam propagating from all directions in the optical wiring layer and can convert the beam into an electrical signal.

As described above, the light emitting and receiving functions can be provided to a photonic device having almost the same structure.

Further, it is possible to directly convert a logic signal from other LSI circuits into an optical signal or to directly convert an optical signal into an electrical signal by integrating electronic circuits such as a drive circuit for the ring LD, a bias circuit for the ring PD, and an amplifier into that device. FIGS. 11A and 11B are schematic diagrams of the photonic disk device. FIG. 11A is a plan view with a fragmentary cross sectional view of the ring LD section for the left half. FIG. 11B is an elevational view with a fragmentary cross sectional view taken along lines 11B—11B for the left half. The ring LD section has almost the same structure as shown in FIGS. 10A and 10B. It comprises an n-type clad layer 1302, an active layer 1303, and a p-type clad layer 1304 to constitute an optical device area 1402. The substrate is removed to provide a thin film. The optical device area 1402 is sandwiched between Si device areas 1401a and 1401b having electronic circuits 1403 thereon. Electrode pads 1105 are formed on the surface for input/output operations of a logic signal.

BRIEF DESCRIPTION OF THE DRAWINGS

FIG. 7 is a schematic diagram for explaining the electronic circuit board according to the present invention;

FIG. 8 is a schematic diagram for explaining the electronic circuit board according to the present invention;

DETAILED DESCRIPTION OF THE PREFERRED EMBODIMENTS (Embodiment 1)

Figure 1:
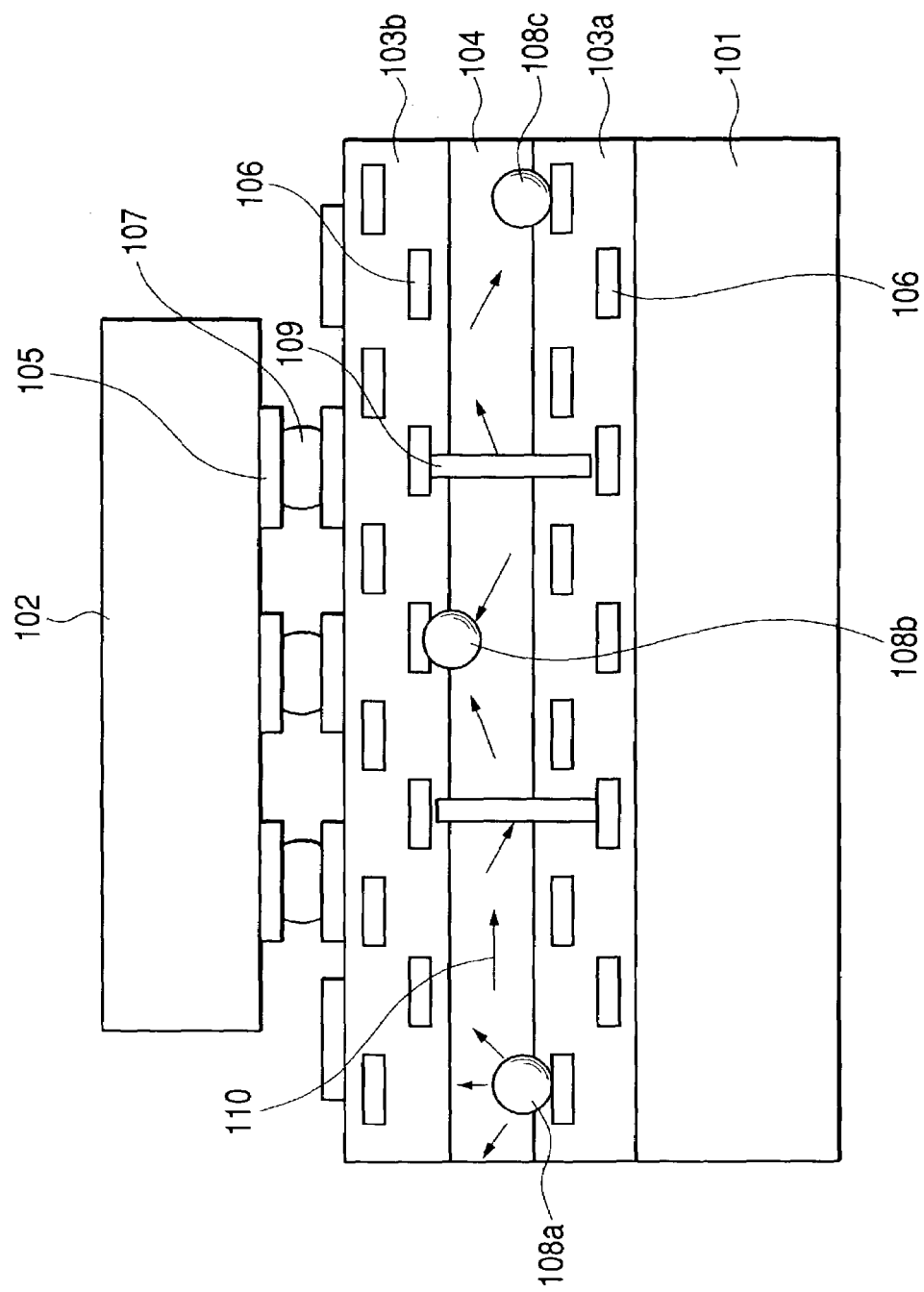
FIG. 1 is a schematic diagram for explaining an electronic circuit board according to the present invention.

FIG. 1 is a sectional view of the electronic circuit board according to the present invention. Photonic ball ICs are provided at upper and lower interfaces of an optical wiring layer.

In FIG. 1, the reference numeral 101 represents a circuit board base, 103a and 103b electrical wiring layers, and 104 a film-shaped optical wiring layer sandwiched between the electrical wiring layers. The reference numeral 102 denotes an IC chip mounted on the surface of the electrical wiring layer 103b by means of bumps (e.g., solder balls) 107. The reference numerals 108a through 108c represent photonic ball ICs that are mounted at interfaces between the electrical wiring layers 103a and 103b and the optical wiring layer 104. The reference numeral 106 represents micro-strip lines formed in the electrical wiring layers or on the surface thereof. The reference numeral 105 represents electrode pads electrically connected to them. The reference numeral 109 represents vias that make electrical connection between the electrical wiring layers through the optical wiring layer.

(Photonic Ball IC)

One of the features of the present invention is to use the E/O or O/E device for connection between the electrical wiring layers 103a and 103b and the optical wiring layer 104. The following provides a brief description on the photonic ball IC as an example of the E/O or O/E device. (For details on the manufacturing method and the like, refer to Japanese Patent Application No. 2000-090826 Optoelectronic device having a three-dimensional configuration".)

Figure 3:
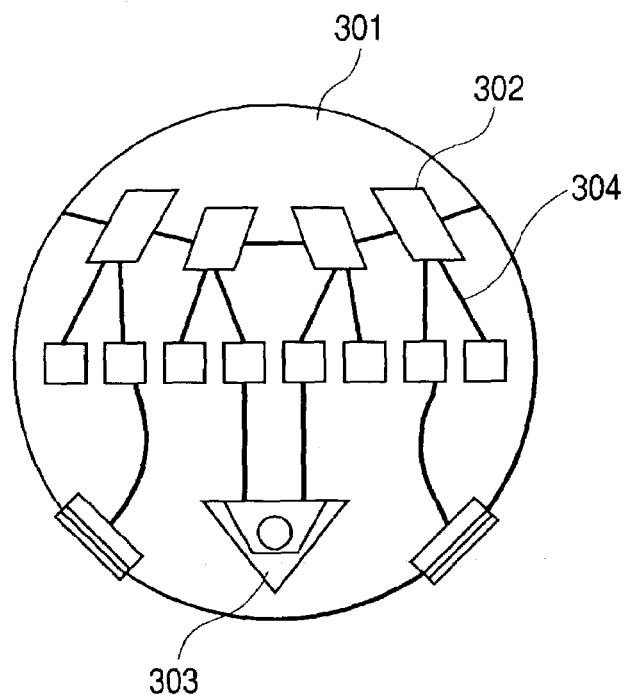
FIG. 3 shows a configuration example of a photonic ball IC used in the present invention.

In FIG. 3, the reference numeral 301 represents an undoped spherical Si substrate (e.g., 1 mm diameter). The reference numeral 302 represents an IC formed on its hemisphere surface (northern hemisphere surface in this example). The reference numeral 303 represents an optical device such as a light emitting element, a light receiving element, or the like formed on the southern hemisphere surface. (The optical device here is assumed to be a GaInNAs/AlGaAs based surface emitting laser or surface photodiode formed on four (111) equivalent surfaces but is not limited thereto.) Electrical wiring 304 connects the above-mentioned components with each other.

When integrated with the light emitting element 303, the IC 302 may be a drive IC or a parallel-serial conversion circuit. When integrated with the light receiving element 303, the IC 302 may be a bias circuit, a preamplifier, a waveform adjustment circuit, or a serial-parallel conversion circuit. Of course, when supporting both the functions, corresponding electronic circuits need to be added. These circuits can be fabricated through a normal CMOS process. Its logic voltage is 3.3 V.

Figure 4:
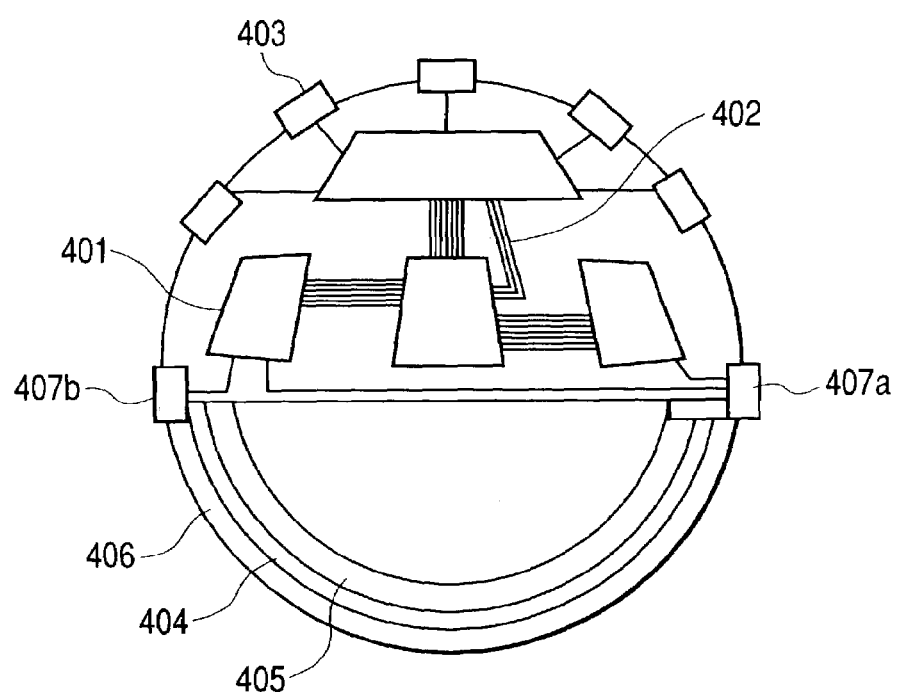
FIG. 4 shows another configuration example of the photonic ball IC used in the present invention.

FIG. 4 shows another configuration of the photonic ball IC. Similarly to the above-mentioned configuration, the electronic circuit section contains electronic circuits 401, electrical wiring 402, electrode pads 403 for the electronic circuits, and the like. However, the optical device section is largely different. The reference numeral 405 denotes a hemispherical active layer. For the light emitting device, the active layer 405 causes light emission due to recombination of carriers injected from the electrodes 407a and 407b for the optical device. For the light receiving device, a reverse bias is applied to the active layer 405. The received beam forms a pair of electron and hole. In either case, the photonic ball IC, because of its spherical shape, can highly efficiently perform the E/O or O/E conversion without needing a special optical system for light emission and absorption. Outside the active layer 405, there are formed a clad layer 404 and a contact layer 406 in this order.

The following describes the manufacturing method.

(Electrical Wiring Layer)

In FIG. 1, the electrical wiring layer 103a is first formed on the circuit board base 101.

In this example, a hot-melt resin material (e.g., polyimide 0.3 mm thick) containing the Cu micro-strip lines 106 constituted of a plurality of layers is formed on the glass epoxy resin circuit board base 101.

(Mounting the Photonic Ball IC on the Electrical Wiring Layer)

Figure 5:
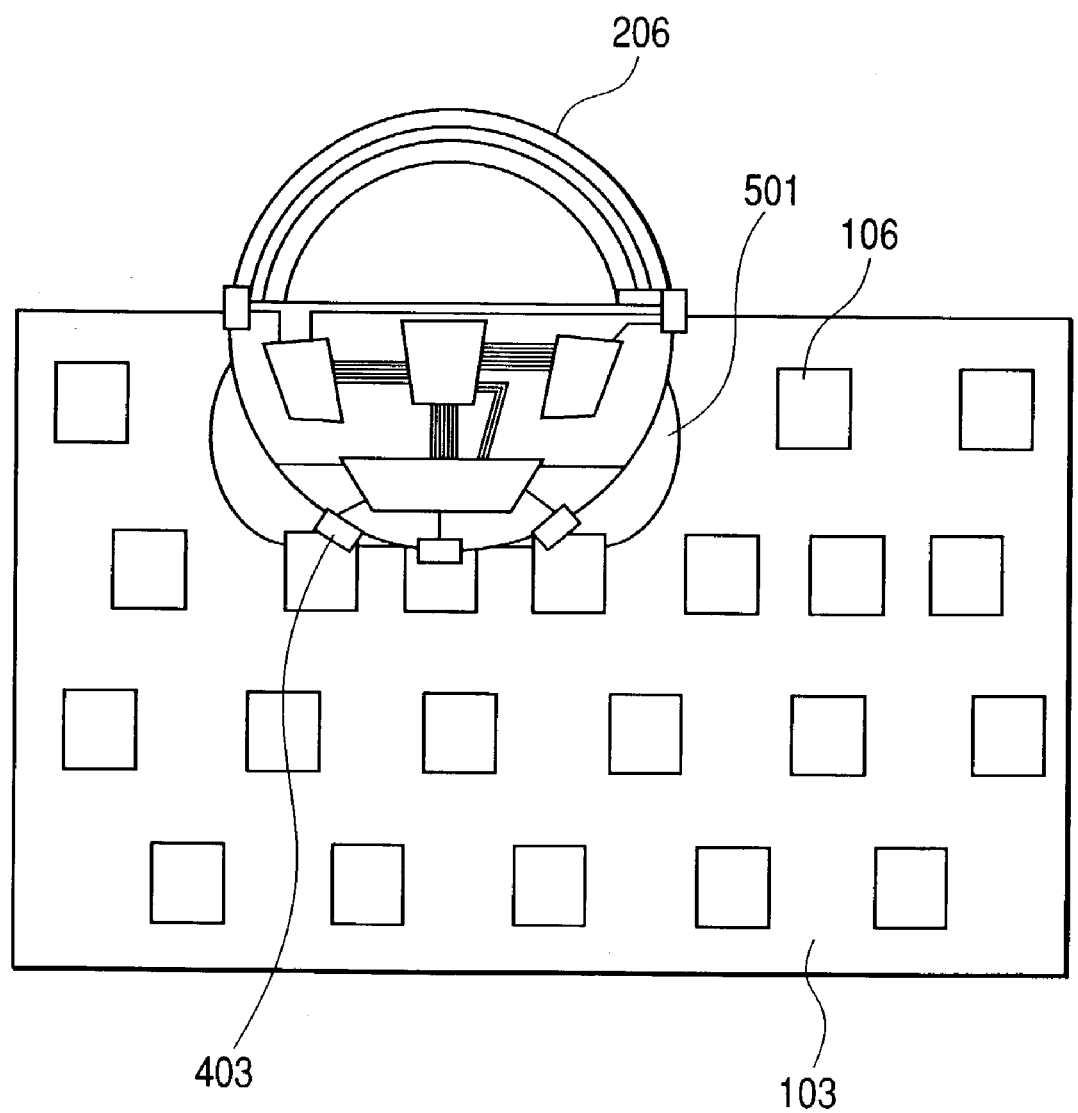
FIG. 5 is an explanatory diagram for a method of mounting the photonic ball IC used in the present invention.

Then, the photonic ball ICs 108a and 108c are mounted. The following describes the mounting method of the spherical optical device with reference to FIG. 5. First, in order to mount the photonic ball IC, a hemispherical hole is dug at a specified position on the surface of the electrical wiring layer. Any method can be used to dig the hole.

The hole may be formed by using photo-lithography and etching. Alternatively, the hole may be formed independently at any position by using a laser processing apparatus or the like.

Here, an excimer laser is used to successively form holes 501 with a specified shape at specified positions. This method can use CAD data as is for manufacturing the circuit board, ensuring accuracy in the two-dimensional directions and improved controllability in the depth direction.

The electrode pads 403 of the ball IC 206 and the electrical wiring 106 of the electrical wiring layer 103*a* are to each other. An anisotropic conductive resin or the like is used to make an electrical and mechanical contact.

After this step, electrical wiring may be further provided on the surface if needed.

(Manufacturing the Optical Wiring Layer)

The optical wiring layer may have any configuration if the following conditions are satisfied.

(1) There should be a two-dimensional slab optical waveguide for guiding a beam.

A minimal transmission loss is preferable, however, depending on a transmission distance. When the circuit board is several centimeters square, for example, a transmission loss should desirably be 0.1 dB/cm or less for the wavelength of a beam to be guided.

(2) The electrical wiring layer should be able to be manufactured on the surface.

This aims at using a conventional electrical wiring pattern as is.

(3) The mounted photonic ball IC should be able to be embedded.

For the present embodiment that satisfies these three points, an organic resin such as polyimide is applied and flattened to manufacture an optical wiring layer comprising a film-shaped optical waveguide approximately 1 mm thick. The embodiment uses a film-shaped optical waveguide comprising a single layer but is not limited to this structure. It may be preferable to use a slab waveguide structure in which a core layer (0.1 mm thick, refractive index n1) is sandwiched between clad layers (0.3 mm thick, refractive index n2, where n1>n2). It is effective to successively form the second electrical wiring layer 103*b* (with the photonic ball IC).

According to the above-mentioned process, the first electrical wiring layer 103*a*, the optical wiring layer 104, and the second electrical wiring layer 103*b* are layered on the circuit board base 101 as shown in FIG. 1. Finally, the IC chip 102 is surface mounted on the second electrical wiring layer 103*b* via the solder bumps 107 and the like to complete the embodiment according to the present invention.

(Principle of Operations)

The following describes the principle of operations.

(Transmission Function)

In FIG. 1, the electrode pads 105 of the LSI 102 are connected to the electrical wiring layer via the bumps 107 to transmit or receive an electrical signal from a nearby electronic device. A logic signal from the LSI (e.g., 3.3 V for CMOS) provides a sufficient voltage to directly drive the above-mentioned spherical optical device. When the logic signal is applied to a light emitting device (e.g., LED) on the photonic ball IC 108*a* directly mounted on the electrical wiring layer 103*a* so that a forward bias is generated, the electrical signal is converted into an optical signal. (When power is required or a specified bias voltage needs to be applied, it just needs to fabricate a driver circuit or a bias on the photonic ball IC 108*a*.) The E/O converted optical signal is emitted to the optical wiring layer 104 and diffuses and propagates as an output beam 110 to the entire optical sheet without need for a special optical system. When the circuit board size is approximately 30 mm□ and the transmission loss is 0.1 dB/cm or less, an optical output of approximately 1 mW can sufficiently obtain a reception input needed for the minimum receiving sensitivity.

(Reception Function)

By contrast, an input optical signal 110 propagates from any direction of the optical wiring layer 104. When the optical signal 110 reaches surfaces of the light receiving elements of the photonic ball ICs 108*b* and 108*c*, the optical signal 110 is introduced into the inside. The optical signal 110 is thus absorbed near a reversely biased PN junction and is converted into an electrical signal. The converted electrical signal works as an input electrical signal, and is introduced into the LSI 102 to be processed there via the adjacent electrical wiring layer 103*b*.

(Electro-parallel and Opto-serial Transmission)

Figure 2:
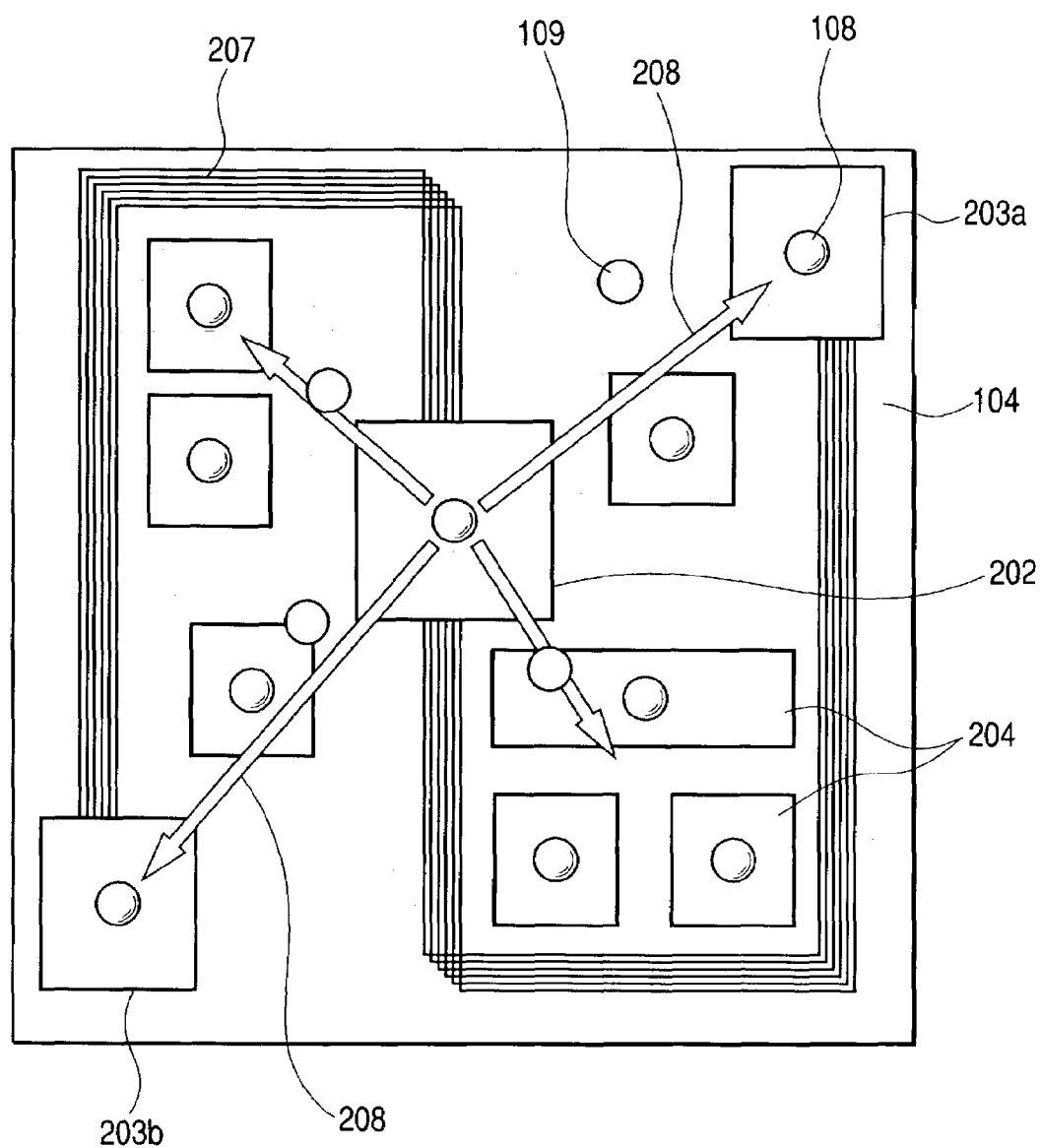
FIG. 2 is a schematic diagram for explaining signal transmission on the electronic circuit board according to the present invention.

The following describes the electro-parallel and opto-serial transmission, one of actual examples, with reference to FIG. 2. In FIG. 2, the reference numeral 202 represents a CPU, 203*a* and 203*b* RAMs, 204 other electronic devices, 207 parallel electrical wiring formed in the electrical wiring layer, and 208 optical wiring (optical path) in the optical wiring layer 104.

Normal electrical wiring requires a 64-bit data line comprising six transmission paths. Even if low-speed data processing causes no problem, high-speed transmission of a large amount of data (e.g., motion pictures) is susceptible to influences of operations of the other devices arranged on the same circuit board or easily causes influences of EMI. It is very difficult for the conventional wiring to always constantly transmit data. The optical wiring is used for this purpose.

In FIG. 2, for example, six electrical wiring lines are needed for the 64-bit data transmission from the CPU 202 to the RAMs 203*a* and 203*b*. If the CPU performs a parallel-serial conversion at its last processing stage and one optical I/O element is connected thereto, the parallel electrical signal is transmitted as a serial optical signal over the optical waveguide of the opto-electronic circuit board. The optical signal is received and O/E converted at the receiving optical I/O element and then is serial-parallel converted to generate a 64-bit parallel electrical signal. While the parallel-serial conversion increases the clock, propagation to the optical waveguide causes no problems of EMI.

While the embodiment selects the optical wiring from the beginning, it is not necessary to always use only the optical wiring. When there is available an option of selecting the electrical wiring, it is possible to make connection by means of the electrical wiring or the optical wiring depending on needs. This flexibility is one of the major advantages of the present invention.

The electrical wiring may need to be designed to detour other devices in order to avoid EMI. As a result, the wiring becomes long, causing wiring delay or waveform distortion. In such case, selecting the optical wiring can provide an EMI-free connection by the shortest route, causing no wiring delay nor waveform distortion. According to the embodiment, the via 109 is formed by piercing the optical waveguide layer 104. Since an optical signal propagates by diffusion, however, its influence is negligible unless the via density becomes excessively large.

A device that manages the bus ultimately determines which signal should use the electrical wiring or the optical wiring. The signal converted into a light beam propagates by diffusing in the optical wiring layer and approaches the IC arranged at a different location. Near this IC, there is also arranged the photonic ball IC 108 for O/E conversion. The embodiment arranges the same photonic ball IC. Since its surface is spherical, the light is directly received by the pn junction surface without using a prism or a mirror, making it possible to very easily mount the photonic ball IC.

(Effects)

(1) The optical wiring is available without making a large change in the conventional electrical wiring pattern.

(2) A method compliant with the conventional electrical mounting method can be used to mount the E/O device or the O/E device.

(3) The use of the two-dimensional optical waveguide layer (optical film) on the circuit board enables free optical wiring, high-speed transmission, and EMI-free transmission.

(4) The same signal can be transmitted over the electrical wiring or the optical wiring depending on uses.

The following methods have been proposed to connect two-dimensional optical waveguides onto the surface:

(1) Methods of arranging mirrors and prisms such as "Optical connection apparatus and method of manufacturing the same" (Japanese Patent Application Laid-Open No. 8-220357) and SPIE Optoelectronic Interconnects and Packaging, CR62 (1996), 329; and (2) Methods of arranging gratings and holograms.

However, these methods are liable to such problems as: 1) the optical axis alignment is difficult; 2) the number of parts increases; 3) the optical waveguide requires micro-processing; 4) it is difficult to arrange devices at any desired positions because the optical waveguide needs to be microprocessed; and 5) it is difficult to transmit or receive an optical signal in any desired direction.

According to the embodiment, for example, a light beam from the light emitting section is directly applied to the inside of the optical wiring layer or to an interface between the optical wiring layer and the electrical wiring layer. It is therefore possible to eliminate the problem of the optical axis alignment and efficiently input or output light beams.

(Embodiment 2)

Figure 6:
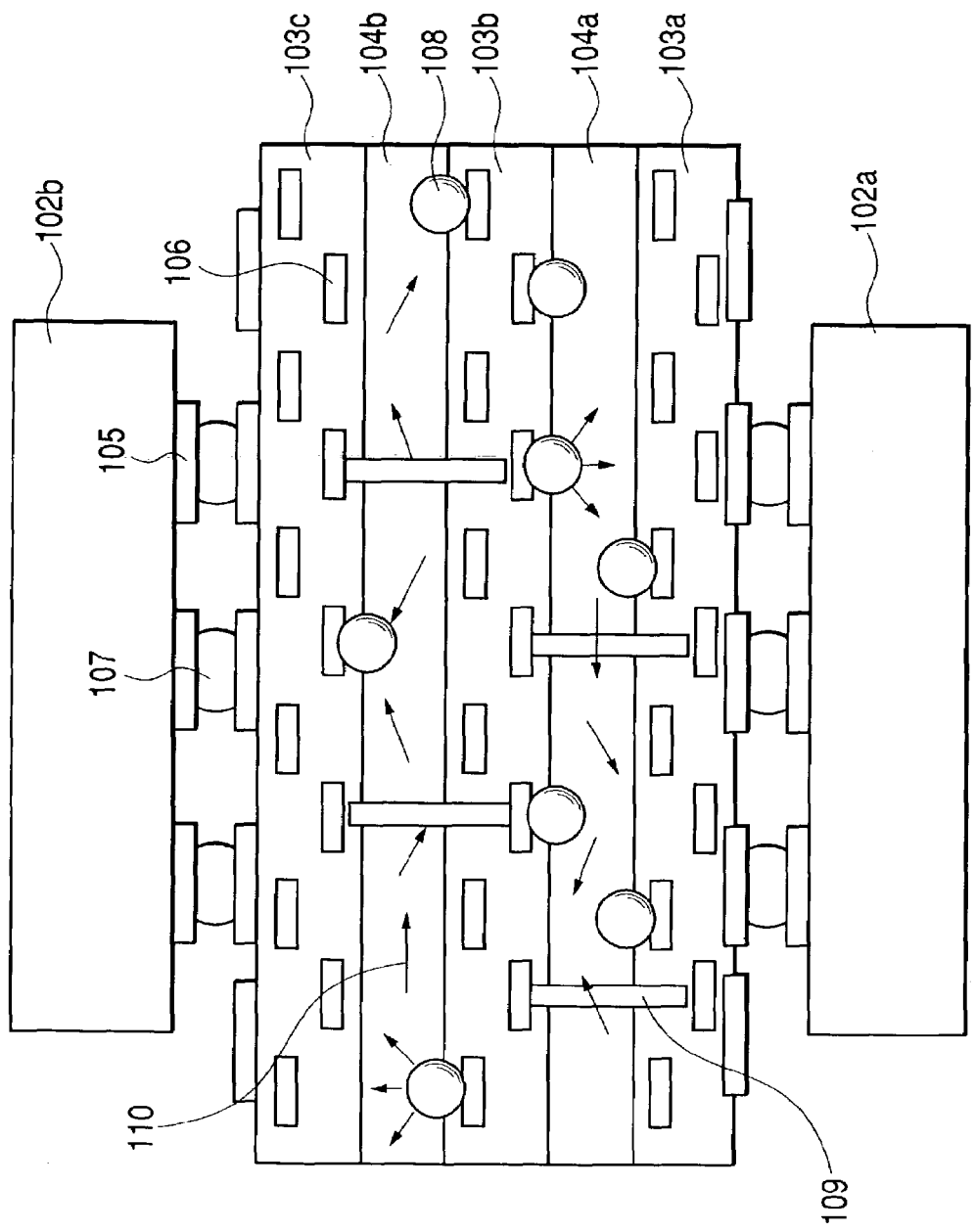
FIG. 6 is a schematic diagram for explaining the electronic circuit board according to the present invention.

FIG. 6 schematically shows a sectional view of a second embodiment of the present invention.

Differences from the first embodiment are: (1) optical wiring layers 104a and 104b are multilayered; (2) no circuit board base is used; and (3) electronic devices 102a and 102b are mounted on both surfaces. The mutually corresponding members in FIGS. 6 and 1 are designated by the same reference numerals.

(Common Points)

(1) Each of the optical wiring layers 104a and 104b transmits data by diffusing an optical signal two-dimensionally.

(2) vias are to connect electrical wiring layers 103a through 103c with each other.

The embodiment is briefly supplemented as follows.

According to embodiment 1, the photonic ball ICs 108 are mounted at specified positions on the surface of the electrical wiring layer 103a (e.g., PMMA).

The optical wiring layer 104a is formed on the surface thereof.

The photonic ball ICs 108 are mounted on the second electrical wiring layer 103b which is then bonded to the optical wiring layer.

Vias are provided at specified positions and are plated or processed otherwise to make an electrical contact.

By repeating these four steps, it is possible to manufacture a multilayer electronic circuit board comprising alternately layered electrical wiring layers and optical wiring layers.

According to the embodiment, all the optical wiring layers comprise a sheet-shaped optical waveguide. However, applicable examples are not limited thereto. For example, it may be preferable to form a one-dimensional optical waveguide that confines light completely.

(Embodiment 3)

The ball IC is also used as a scatterer.

FIG. 7 is a schematic diagram for explaining the third embodiment. The mutually corresponding members in FIGS. 7 and 1 are designated by the same reference numerals.

Main differences from the first embodiment are as follows.

(1) Optical scatterers 111a through 111c are arranged near the photonic ball ICs 108a through 108c.

(2) When light is emitted, each optical scatterer functions as a scatterer to diffuse the light throughout the optical wiring layer 104.

(3) When light is received, each optical scatterer functions as a condenser to efficiently condenses the light to the light receiver just above.

The embodiment is briefly supplemented as follows.

According to embodiment 1, the photonic ball ICs 108a and 108c and the optical scatterer or condenser 111b are mounted at specified positions on the surface of the electrical wiring layer 103a (e.g., PMMA).

The optical wiring layer 104 is formed on the surface thereof.

The photonic ball IC 108b and the optical scatterers (or condensers) 111a and 111c are mounted on the second electrical wiring layer 103b which is then bonded to the optical wiring layer 104.

The vias 109 are provided at specified positions and are plated or processed otherwise to make an electrical contact.

By repeating these four steps, it is possible to manufacture a multilayer electronic circuit board comprising alternately layered electrical wiring layers and optical wiring layers.

A function of the optical scatterer is to reflect the light from the photonic ball IC to an optical diffusion layer as much as possible.

Another function of the optical condenser is to condense the light propagating in the optical wiring layer into the vicinity of the photonic ball IC as much as possible and improve the light receiving efficiency.

Both are specifically structured to be:

(1) Conical shape (having a high-reflectance surface);

(2) An aggregate of fine particles as small as the wavelength; or (3) A ring-shaped grating element.

These belong to a known structure.

The embodiment uses an Si ball IC coated with a high-reflectance film in consideration of not only the condensing efficiency and the scattering efficiecy, but also ease of mounting and costs. The photonic ball IC itself may be used as a scatterer or a condenser.

An effect specific to embodiment 3 is to be able to manufacture an electronic circuit board having high scattering and condensing efficiency.

(Embodiment 4)

A photonic disk IC is placed in the optical wiring layer.

FIG. 8 is a sectional view of a fourth embodiment of the present invention. In FIG. 8, the reference numeral 101 represents the circuit board base, 103a and 103b the electrical wiring layers, and 104 the film-shaped optical wiring layer sandwiched between the electrical wiring layers. The reference numeral 102 denotes the IC chip mounted on the surface of the electrical wiring layer 103b by means of the bumps (e.g., solder ball) 107. The reference numerals 108a through 108c represent photonic disk ICs that are mounted in the optical wiring layer 104. The reference numeral 106 represents the electrical wiring (e.g., the micro-strip lines) formed in the electrical wiring layer or on the surface thereof. The reference numeral 105 represents the electrode pads electrically connected to them.

The following describes the manufacturing method with reference to FIGS. 9A, 9B, 9C and 9D.

(Electrical Wiring Layer)

The electrical wiring layer 103 is first formed on the circuit board base 101.

Figure 9A:
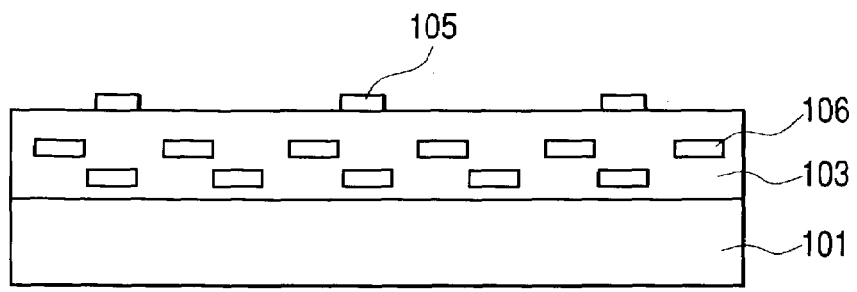
FIGS. 9A, 9B, 9C, and 9D are schematic diagrams showing a manufacturing process of the electronic circuit board in FIG. 8.

In this example, a hot-melt resin material 103 (0.3 mm thick) containing the Cu micro-strip lines 106 constituted of a plurality of layers is formed on the glass epoxy resin circuit board base 101. On its surface, there are formed the electrode pads 105 that electrically connects with the O/E or E/O device (FIG. 9A).

(Mounting the Photonic Disk IC on the Electrical Wiring Layer)

Figure 9B:
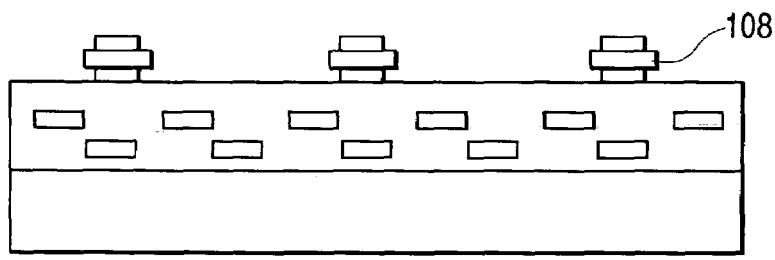

Then, the photonic disk ICs 108 are mounted. The electrode pads of the photonic disk ICs are aligned with the electrode pads 105 of the electrical wiring layer. An anisotropic conductive resin, a solder ball, or the like is used to make an electrical and mechanical contact (FIG. 9B).

(Manufacturing the Optical Wiring Layer)

The optical wiring layer may have any configuration and material if the following conditions are satisfied.

(1) There should be a two-dimensional slab optical waveguide for guiding a beam.

(2) A transmission loss should be small.

A minimal transmission loss is preferable, however, depending on a transmission distance. When the circuit board is several centimeters square, for example, the transmission loss should desirably be 0.1 dB/cm or less.

(3) The mounted photonic disk IC should be able to be embedded.

Figure 9C:
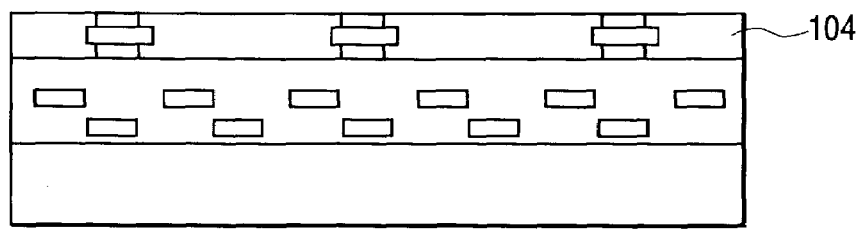

For the present embodiment that satisfies these three points, an organic resin such as polyimide is applied and flattened to manufacture an optical wiring layer 104 comprising a film-shaped optical waveguide approximately 0.3 mm thick (FIG. 9C).

The embodiment uses the film-shaped optical waveguide comprising a single layer but is not limited to this structure. It may be preferable to use a slab waveguide structure in which a core layer (0.05 mm thick, refractive index n1) is sandwiched between clad layers (0.1 mm thick, refractive index n2, where n1>n2).

Figure 9D:
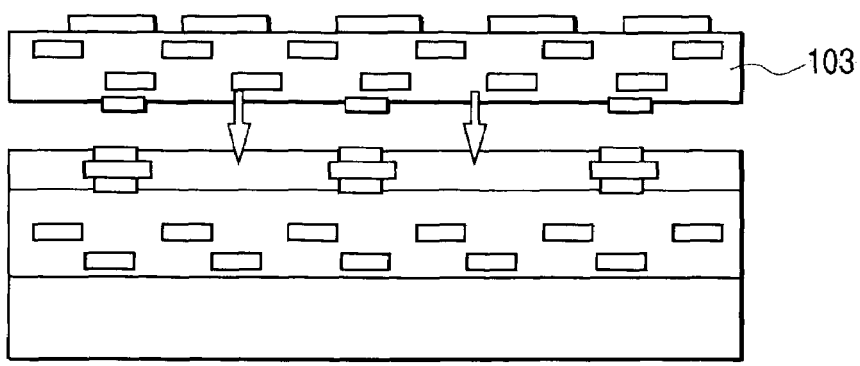
Figure 10A:
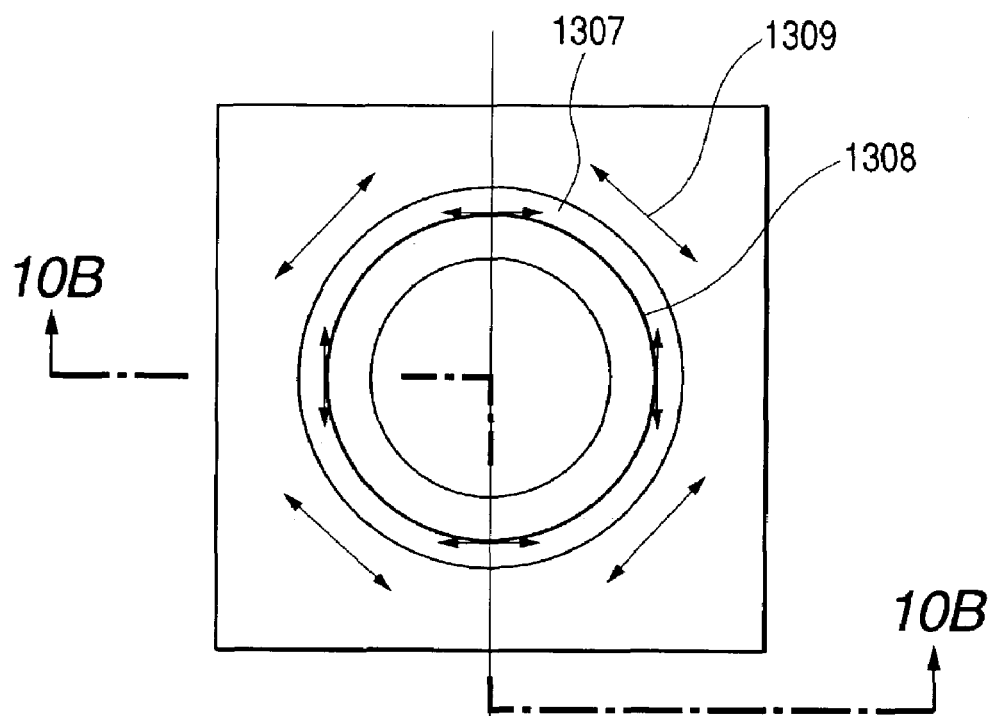
FIGS. 10A and 10B show a configuration example of the photonic disk IC used in the present invention.
Figure 10B:
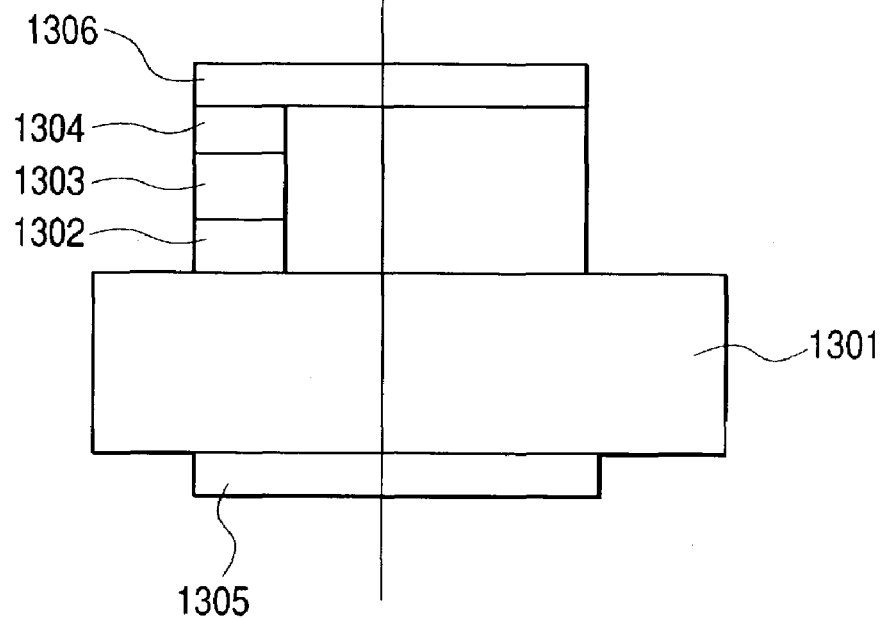
Figure 11A:
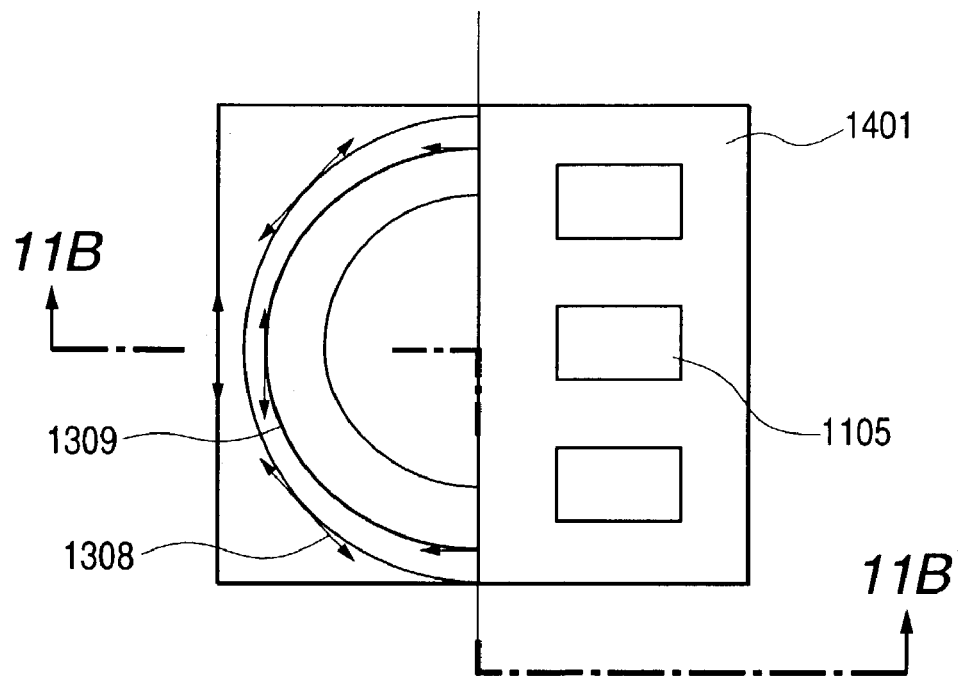
FIGS. 11A and 11B show another configuration example of the photonic disk IC used in the present invention.
Figure 11B:
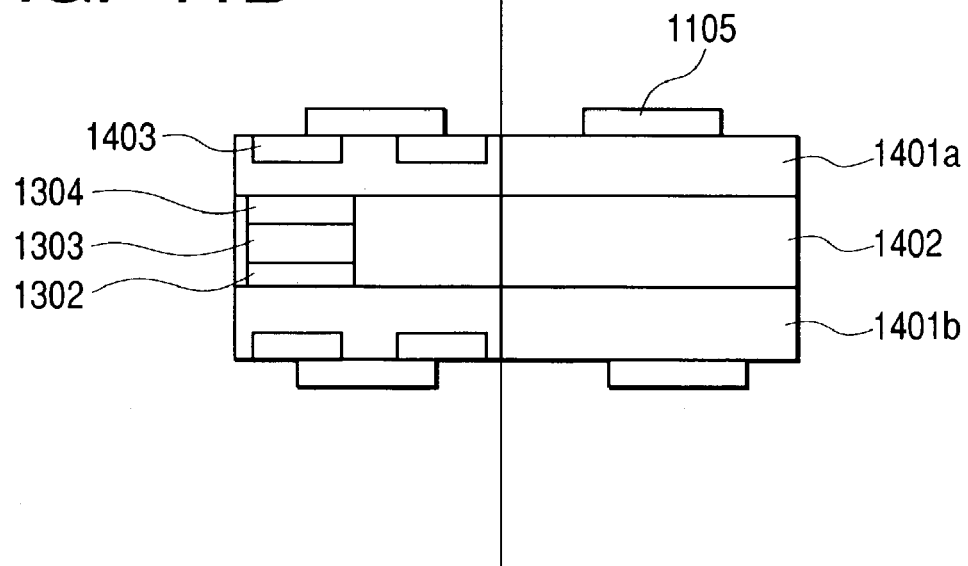

The second electrical wiring layer 103 (with the electrode pad) is then formed (FIG. 9D).

According to the above-mentioned process, the first electrical wiring layer 103a, the optical wiring layer 104, and the second electrical wiring layer 103b are layered on the circuit board base 101 as shown in FIG. 8. Finally, the IC chip 102 is surface mounted on the second electrical wiring layer via the solder bumps 107 and the like to complete the embodiment according to the present invention.

(Principle of Operations)

The following describes the principle of operations.

(Transmission Function)

In FIG. 8, the electrode pads 105 of the LSI 102 are connected to the electrical wiring layer 103b via the bumps 107 to transmit or receive an electrical signal from a nearby electronic device. A logic signal from the LSI (e.g., 3.3 V for CMOS) provides a sufficient voltage to directly drive the above-mentioned spherical optical device. When the logic signal is applied to a light emitting device (e.g., LED) on the photonic disk IC 108a directly mounted on the electrical wiring layer so that a forward bias is generated, the electrical signal is converted into an optical signal 110. (When power is required or a specified bias voltage needs to be applied, it just needs to fabricate a driver circuit or a bias on the photonic disk IC 108a.) The E/O converted optical signal is emitted to the optical wiring layer 104 and diffuses and propagates as an output beam 110 to the entire optical sheet without need for a special optical system. When the circuit board size is approximately 30 mm□ and the transmission loss is 0.1 dB/cm or less, an optical output of approximately 1 mW can sufficiently obtain a reception input needed for the minimum receiving sensitivity.

(Reception Function)

By contrast, an input optical signal 110 propagates from any direction of the optical wiring layer 104. When the optical signal 110 reaches the surface of the light receiving element of the photonic disk IC, the optical signal is introduced into the inside. The optical signal is absorbed near a reversely biased PN junction and is converted into an electrical signal. The converted electrical signal works as an input electrical signal, and is introduced into the LSI 102 to be processed there via the adjacent electrical wiring layer 103b.

(Electro-parallel and Opto-serial Transmission)

The following describes the electro-parallel and opto-serial transmission, one of actual examples, with reference to FIG. 2. In FIG. 2, the reference numeral 202 represents the CPU, 203a and 203b the RAMs, 204 the other electronic devices, 207 the parallel electrical wiring formed in the electrical wiring layer, and 208 the optical wiring (optical path) in the optical wiring layer 104.

Normal electrical wiring requires a 64-bit data line comprising six transmission paths. Even if low-speed data processing causes no problem, high-speed transmission of a large amount of data (e.g., motion pictures) is susceptible to influences of operations of the other devices arranged on the same circuit board or easily causes influences of EMI. It is very difficult for the conventional wiring to always constantly transmit data. The optical wiring is used for this purpose.

In FIG. 2, for example, six electrical wiring lines are needed for the 64-bit data transmission from the CPU 202 to the RAMs 203a and 203b. If the CPU performs a parallel-serial conversion at its last processing stage and one optical I/O element is connected thereto, the electrical signal is transmitted as a serial optical signal over the optical waveguide of the opto-electronic circuit board. The optical signal is received and O/E converted at the receiving optical I/O element and then is serial-parallel converted to generate a 64-bit parallel signal. While the parallel-serial conversion increases the clock, propagation to the optical waveguide causes no problems of EMI.

While the embodiment selects the optical wiring from the beginning, it is not necessary to always use only the optical wiring. When there is available an option of selecting the electrical wiring, it is possible to make connection by means of the electrical wiring or the optical wiring depending on needs. This flexibility is one of the major advantages major features of the present invention.

The electrical wiring may need to be designed to detour the other devices in order to avoid EMI. As a result, the wiring becomes long, causing wiring delay or waveform distortion. In such case, selecting the optical wiring can provide an EMI-free connection by the shortest route, causing no wiring delay nor waveform distortion.

A device that manages the bus ultimately determines which signal should use the electrical wiring or the optical wiring. The signal converted into a light beam propagates by diffusing in the optical wiring layer and approaches the IC arranged at a different location. Near this IC, there is also arranged the photonic ball IC for O/E conversion. The embodiment arranges the same photonic ball IC. Since its surface is spherical, the beam is directly received by the pn junction surface without using a prism or a mirror, making it possible to very easily mount the photonic ball IC.

According to the embodiment, vias may be formed by piercing the optical waveguide layer. Since an optical signal propagates by diffusion, however, its influence is negligible unless the via density becomes excessively large.

While the embodiment uses the photonic disk IC mounted with the integrated electronic circuit, it may also be preferable to use a simple ring LD or PD, instead, with no electronic circuit integrated. In such case, it may be necessary to separately provide a circuit to control these devices.

Further, it is possible to manufacture a flexible circuit board by using a flexible material (e.g., this embodiment) for the electrical wiring layer and the optical wiring layer.

(Effects)

(1) The optical wiring is available without making a large change in the conventional electrical wiring pattern.

(2) A method compliant with the conventional electrical mounting method can be used to mount the E/O device or the O/E device.

(3) The use of the two-dimensional optical waveguide layer (optical film) on the circuit board enables free optical wiring, high-speed transmission, and EMI-free transmission.

(4) The same signal can be transmitted over the electrical wiring or the optical wiring depending on uses.

(Embodiment 5)

A photonic disk is provided in each optical wiring layer of the multilayer electronic circuit board.

Figure 12:
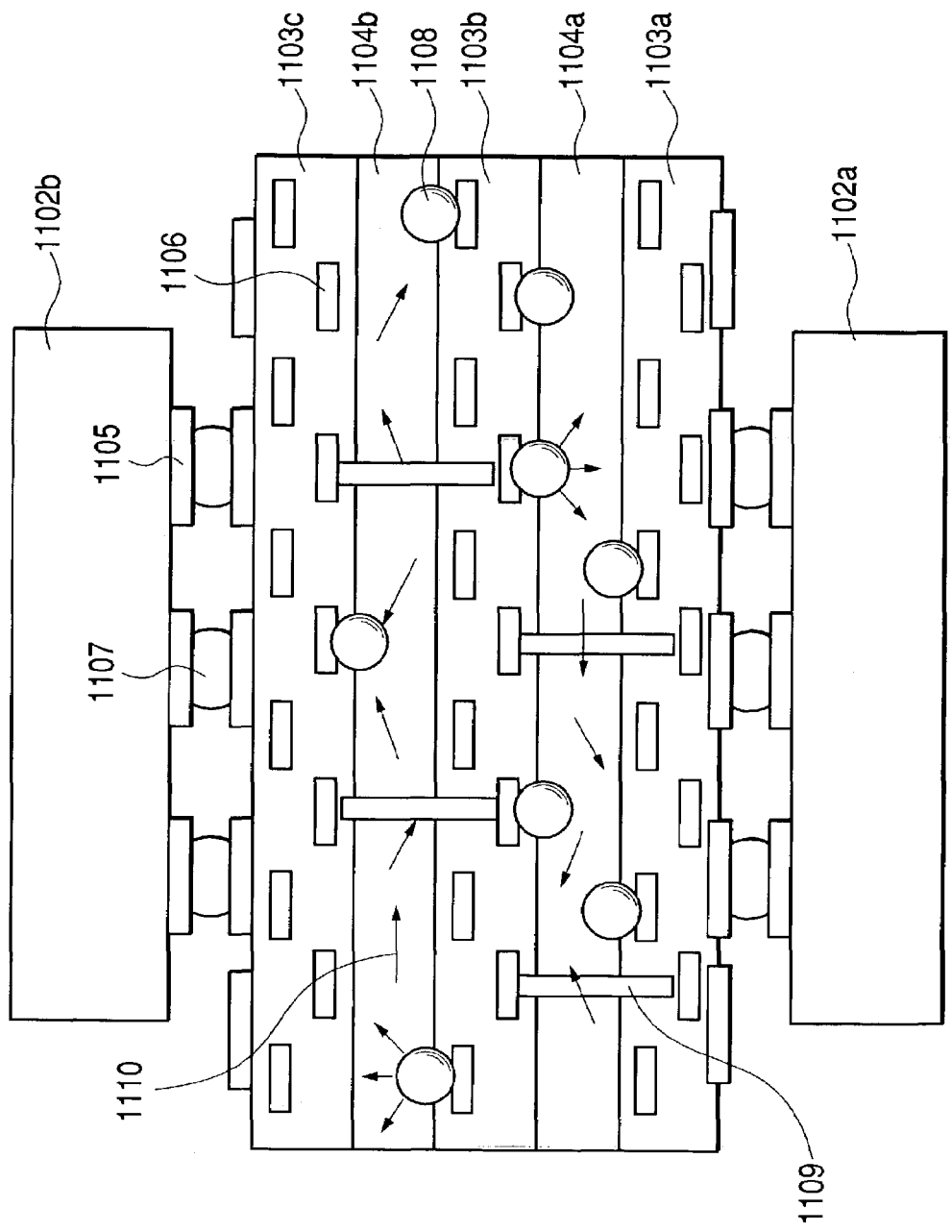
FIG. 12 is a schematic diagram for explaining the electronic circuit board according to the present invention.

FIG. 12 schematically shows a sectional view of a fifth embodiment of the present invention.

The following mainly describes differences from the fourth embodiment.

(Differences)

(1) Optical wiring layers are multilayered.

(2) No circuit board base is used.

(3) Electronic devices are mounted on both surfaces.

(Common Points)

(1) Each-of optical wiring layers transmits data by diffusing an optical signal two-dimensionally.

(2) vias are used to connect electrical wiring layers with each other.

The embodiment is briefly supplemented as follows.

According to embodiment 1, photonic ball ICs 1108 are mounted at specified positions on surfaces of electrical wiring layer 1103*a* (e.g., PMMA).

An optical wiring layer 1104*a* is formed on the surface thereof.

The photonic ball ICs 1108 are mounted on a second electrical wiring layer 1103*b* which is then bonded to the optical wiring layer.

vias 1109 are provided at specified positions.

By repeating these four processes, it is possible to manufacture a multilayer electronic circuit board comprising alternately layered electrical wiring layers and optical wiring layers.

According to the embodiment, all the optical wiring layers comprise a sheet-shaped optical waveguide. However, applicable examples are not limited thereto. For example, it may be preferable to form a one-dimensional optical waveguide that confines light completely.

(Embodiment 6)

A photonic cylinder is provided in a single-layer optical wiring layer.

While the fourth embodiment has described the use of almost the same ring LD (PD) structure for the E/O and O/E devices, different structures may be used for them. The following describes an example of using a cylindrical ring PD instead of the disk-type ring PD.

Compared to the disk type, the cylindrical ring PD has a thick active layer (e.g., 10 $\mu$m). This aims at improving the minimum receiving sensitivity by increasing a light receiving area. Since the active layer thickness is in proportion to the light receiving surface, increasing the active layer thickness improves the light receiving sensitivity. In order to prevent a response speed from being sacrificed, however, it is necessary to set a high reverse bias voltage.

As mentioned above, the present invention can provide an electronic circuit board capable of efficient input and output of light to an optical wiring layer.

What is claimed is:

1. An electronic circuit board comprising:
   an optical wiring layer sandwiched between two electrical wiring layers, wherein said optical wiring layer is structured to be a two-dimensional optical waveguide;
   an E/O device and an O/E device provided in said optical wiring layer or at an interface between said optical wiring layer and said electrical wiring layer, wherein at least one of said E/O device and said O/E device is spherical; and
   a via piercing said optical wiring layer, wherein said via connects said two electrical wiring layers.

2. The electronic circuit board according to claim 1, wherein said electrical wiring layer includes a parallel signal line with an output terminal connected to said E/O device, and wherein a parallel electrical signal transmitted in said parallel signal line is parallel-serial converted in an electronic circuit provided in said E/O device and is then transmitted as a serial optical signal to said optical wiring layer.

3. The electronic circuit board according to claim 2, wherein the serial optical signal is received by said O/E device, converted into an electrical signal, serial-parallel converted by an electronic circuit provided in said O/E device, and then transmitted to a parallel signal line.

* * * * *

UNITED STATES PATENT AND TRADEMARK OFFICE
CERTIFICATE OF CORRECTION

PATENT NO. : 6,977,820 B2  
APPLICATION NO. : 10/430215  
DATED : December 20, 2005  
INVENTOR(S) : Mamoru Unchida Page 1 of 1

It is certified that error appears in the above-identified patent and that said Letters Patent is hereby corrected as shown below:

COLUMN 1:
Line 38, "sense" should read -- senses --.

COLUMN 3:
Line 3, "is then is" should read -- is --.

COLUMN 12:
Line 20, "condenses" should read -- condense --.

COLUMN 13:
Line 19, "connects" should read -- connect --.

COLUMN 14:
Line 66, "advantages" should read -- advantages and --.

COLUMN 15:
Line 55, "Each-of" should read -- Each of --.

Signed and Sealed this

Twenty-eighth Day of November, 2006

JON W. DUDAS  
*Director of the United States Patent and Trademark Office*